(12) United States Patent
Labetski et al.

(10) Patent No.: US 8,220,315 B2
(45) Date of Patent: Jul. 17, 2012

(54) GAS GAUGE, LITHOGRAPHIC APPARATUS AND DEVICE MANUFACTURING METHOD

(75) Inventors: Dzmitry Labetski, Utrecht (NL); Yuri Johannes Gabriël Van De Vijver, Best (NL)

(73) Assignee: ASML Netherlands B.V., Veldhoven (NL)

( * ) Notice: Subject to any disclaimer, the term of this patent is extended or adjusted under 35 U.S.C. 154(b) by 494 days.

(21) Appl. No.: 12/609,835

(22) Filed: Oct. 30, 2009

(65) Prior Publication Data

US 2010/0116029 A1    May 13, 2010

Related U.S. Application Data

(60) Provisional application No. 61/113,081, filed on Nov. 10, 2008.

(51) Int. Cl.
*G01B 13/08* (2006.01)
(52) U.S. Cl. ........................................................ 73/37.5
(58) Field of Classification Search ............ 73/37, 37.5, 73/37.6, 37.8
See application file for complete search history.

(56) References Cited

U.S. PATENT DOCUMENTS

| | | | |
|---|---|---|---|
| 3,243,992 A * | 4/1966 | Woods | 73/37.5 |
| 3,540,263 A * | 11/1970 | Shigeizumi et al. | 73/37.5 |
| 7,017,390 B1 | 3/2006 | Vogel | |
| 2005/0241371 A1 | 11/2005 | Carter et al. | |
| 2010/0309445 A1 | 12/2010 | Schultz | |

FOREIGN PATENT DOCUMENTS

| | | |
|---|---|---|
| JP | 01-250811 A | 10/1989 |
| JP | 2005-338074 A | 12/2005 |
| JP | 2005-338094 A | 12/2005 |
| JP | 2006-189429 A | 7/2006 |
| JP | 2007-212444 A | 8/2007 |
| JP | 2008-523588 A | 7/2008 |
| JP | 2010-112946 A | 5/2010 |
| JP | 2011-514514 A | 5/2011 |

OTHER PUBLICATIONS

English translation of Notice of Reasons for Rejection directed to related Japanese Application No. 2009-251601, the Japanese Patent Office, mailed Jan. 11, 2012; 4 pages.

* cited by examiner

*Primary Examiner* — Hezron E Williams
*Assistant Examiner* — Nathaniel Kolb
(74) *Attorney, Agent, or Firm* — Sterne, Kessler, Goldstein & Fox P.L.L.C

(57) ABSTRACT

A gas gauge has a gas delivery tube arranged to determine a distance to an object. The gas delivery tube includes a gas conduit through which a suitable measurement gas is supplied. The measurement gas leaves the gas delivery tube under pressure via an outlet and impinges on the object in an interaction area, wherein a pressure of a recoiled gas is measured by a pressure detector. A gas having a low atomic number may be used. The pressure sensor may include a membrane positioned in the gas delivery tube at least partially enveloping the gas conduit at or near the gas outlet. The pressure sensor may include a membrane disk arranged about the gas conduit. The pressure sensor may include a suitable plurality of pressure elements arranged in a substantially common plane and which may be spaced apart yet enveloping the gas conduit.

5 Claims, 4 Drawing Sheets

GAS GAUGE, LITHOGRAPHIC APPARATUS AND DEVICE MANUFACTURING METHOD

CROSS-REFERENCE TO RELATED APPLICATIONS

The present application claims the benefit under 35 U.S.C §119(e) of U.S. Provisional Patent Application No. 61/113,081, filed Nov. 10, 2008, which is incorporated herein by reference in its entirety.

FIELD

Embodiments of the present invention relate to a gas gauge, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

An embodiment of a lithographic apparatus as is set forth in the foregoing is known from U.S. Publ. No. 2005/0241371, which is incorporated by reference herein in its entirety. In the known apparatus use is made of a gas gauge including pressure sensors for measuring distance to a wafer.

SUMMARY

The known gas gauge has a limited sensitivity bandwidth regarding a change in a wafer's landscape profile. The inventors have created a gas gauge for use in a lithographic apparatus with an increased sensitivity for measuring local differences of a wafer's profile.

According to an aspect of the invention, there is provided a gas gauge including a measurement nozzle for determining a distance from the measurement nozzle to an object, the gas gauge including: a gas conduit extending in the measurement nozzle for providing a measurement gas into a measurement nozzle, the measurement nozzle including a pressure sensor for measuring pressure caused by the measurement gas impinging on the object, wherein the gas gauge is operable using a gas with a low atomic number as the measurement gas.

According to another aspect of the invention there is provided a lithographic apparatus including a gas gauge as is set forth in the foregoing.

According to still another aspect of the invention there is provided a device manufacturing method including project- ing a patterned beam of radiation onto a substrate, wherein a surface profile of the substrate is measured using a gas gauge as is set forth in the foregoing.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the relevant art(s) to make and use the invention.

Figure 1:
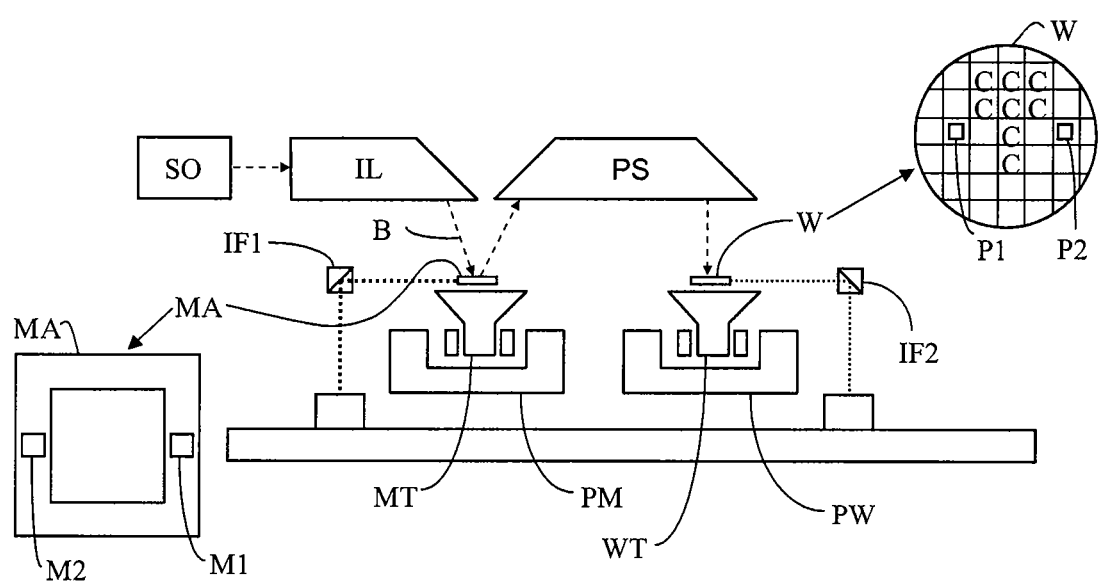
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the invention. The apparatus includes:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF2 (e.g. an interferometric device, linear encoder or capacitive sensor), substrate table WT can be moved accurately, e.g. so as to position different target portions C in the path of radiation beam B. Similarly, first positioner PM and another position sensor IF1 can be used to accurately position mask MA with respect to the path of radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of the target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

The lithographic apparatus as is discussed with reference to the above, according to an aspect of the invention, includes a gas gauge, as is set forth with reference to FIGS. 2-4, for determining a height profile of the wafer.

Figure 2:
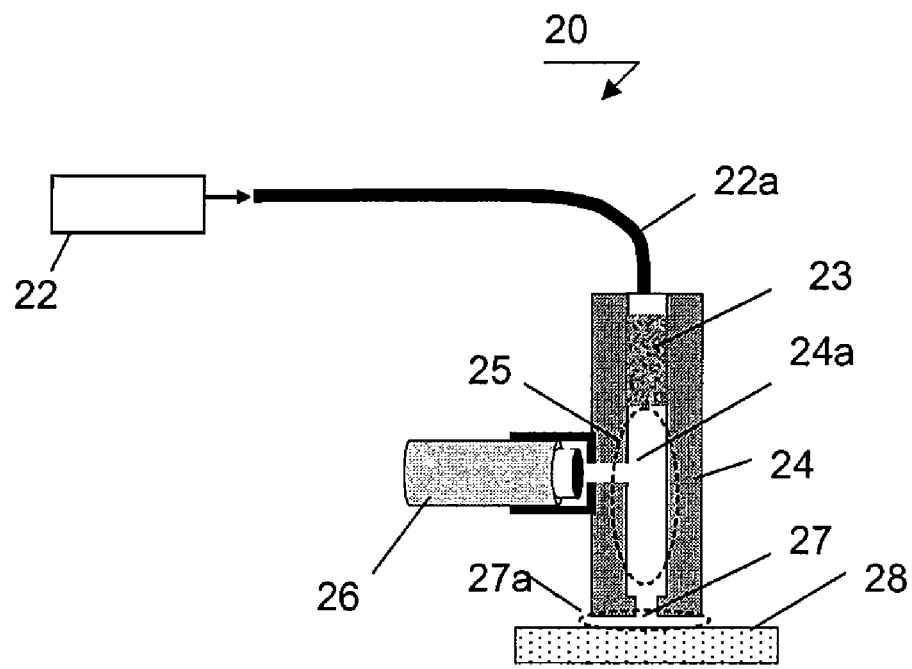
FIG. 2 depicts a schematic view of a gas gauge according to an embodiment of the invention.

FIG. 2 depicts an embodiment of a cross-section of a gas gauge according to an aspect of the invention. A gas gauge 20 includes a gas delivery tube 24 arranged to determine a distance to an object 28, for example a wafer arranged in a lithographic apparatus (not shown). Gas delivery tube 24 includes a gas conduit 24a through which a suitable measurement gas is supplied from a source 22 via an inlet conduit 22a. The measurement gas is conceived to leave gas delivery tube 24 under pressure via an outlet 27 and to impinge on object 28 in an interaction area 27a. When the measurement gas is recoiled from the surface of object 28, its pressure is measured by a pressure detector or measurement unit 26. It will be appreciated that such measurements may be carried out in a dynamic mode, i.e. when the gas delivery tube is scanning the surface of object 28, or in a static mode for one or more dwell positions of gas delivery tube 24 with respect to object 28.

In order to enable a measurement, gas delivery tube 24 may include a restrictor 23 for creating a measurement volume 25 in a vicinity of pressure measurement unit 26. For example, for the pressure measurement unit a microphone may be used. In accordance with an aspect of the invention for the measurement gas a gas having a low atomic number is used. Gas gauge 20 may include or be delivered with a corresponding gas source 22, including a gas of a low atomic number. For example, it is found that good results regarding sensitivity bandwidth are obtained for helium and/or for hydrogen. It will be appreciated that the measurement gas does not have to necessarily include 100% of a gas having a low atomic number. An improvement in sensitivity may be obtained when the measurement gas includes, for example, at least 50% of gas having low atomic number. Further details on sensitivity improvements will be discussed with reference to FIG. 5.

Figure 3:
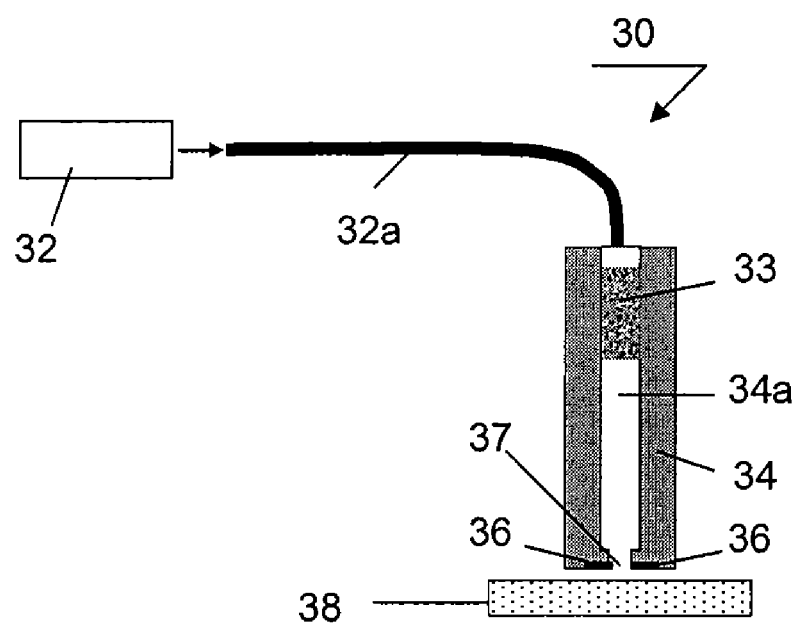
FIG. 3 depicts a schematic view of a gas gauge according to a further embodiment of the invention.

FIG. 3 depicts a schematic cross-sectional view of a further embodiment of a gas gauge according to a further aspect of the invention. A gas gauge 30, similarly to the embodiment shown in FIG. 2, may include a gas source 32 for supplying a suitable measurement gas, for example, a gas having a low atomic number. The measurement gas is supplied into a gas delivery tube 34 via a gas inlet 32a. Gas delivery tube 34 may include a restrictor 33 for defining a measurement chamber. According to an aspect of the invention, gas gauge 30 is provided with a pressure sensor 36, which is arranged in gas delivery tube 34 at least partially enveloping a gas conduit 34a, said sensor being positioned at or near a gas outlet 37. In an embodiment, the pressure sensor includes a membrane disk, which is arranged about gas conduit 34a. It will be appreciated that other geometries of the pressure sensor are possible. For example, the pressure sensor may include a suitable plurality of pressure elements, which are arranged in a substantially common plane and which may be spaced apart yet enveloping gas conduit 34a. In an embodiment, three pressure sensors are used, which may be spaced apart by 120 degrees. More details on configurations of the pressure sensor are given with reference to FIG. 4.

It has been found that by at least partially replacing the outer surface of the gas gauge outlet (e.g., as with item 36 in FIG. 3) with a pressure sensor, such as a pressure sensor membrane, the bandwidth sensitivity of the gas gauge is increased; the pressure sensor membrane may be positioned as close as possible to the gas gauge outlet (e.g., item 37 in FIG. 3). Details on the resulting sensitivity bandwidth are discussed with reference to FIG. 5.

Furthermore, by placing the pressure sensor membrane close to the outer surface of the gas gauge or by replacing the outer surface with pressure sensor membrane, the volume of the gas delivery tube 24 (e.g., item 25 in FIG. 2) can be reduced, which increases the sensitivity bandwidth.

For a gas gauge, such as that shown in FIG. 2, the volume needed to deliver gas to the microphone or pressure sensor 26 is about the same as volume 25 of delivery tube 24. According to an embodiment of the invention, by arranging the pressure sensor at or near the gas outlet, the volume of the gas delivery tube may be decreased by, for example, a factor of 2. Accordingly, the volume of a typical gas delivery tube can be made smaller than, for example, $3.5 \times 10^{-7}$ m$^3$.

Figure 4:
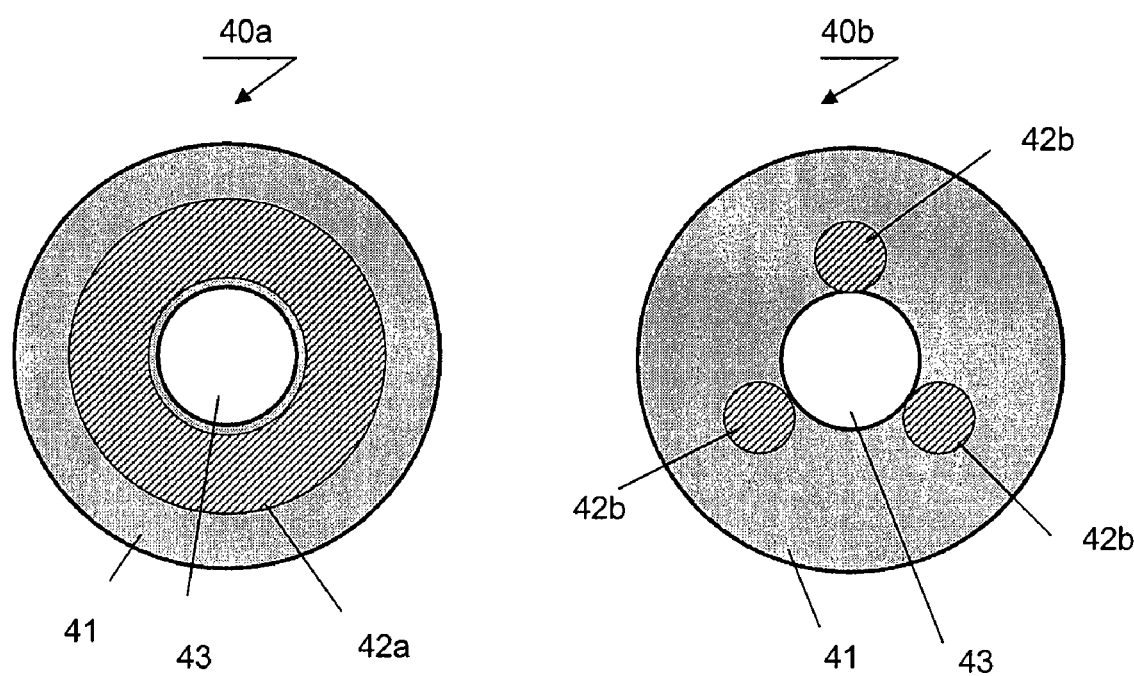
FIG. 4 depicts a schematic view of a cross-section of a gas gauge according to an embodiment of the invention.

FIG. 4 depicts a schematic view of a cross-section of an embodiment of a gas gauge according to an aspect of the invention. View 40a schematically depicts a cross-section of a nozzle 41, including a pressure sensor 42a, arranged about a gas conduit 43. In an embodiment, the pressure sensor 42a includes a membrane disk, having a thickness in a range of, for example, 60 micrometers for the sensors produced using MEMS technology. In this embodiment, pressure sensor 42a may be easily manufactured.

View 40b presents a schematic view of a cross-section of another embodiment of nozzle 41 including a pressure sensor configuration, wherein a plurality of pressure sensor elements 42b is used. In this case the plurality of pressure elements are arranged substantially in one geometrical plane and are mutually displaced to at least partially envelop gas conduit 43. In this configuration, the pressure sensor elements may be aligned to be parallel to a horizontal plane. Suitable materials for manufacturing the pressure sensor include, for example and without limitation, piezo-crystals or semiconductor materials. In an embodiment, the pressure sensors depicted in view 40b have a shape of a disk with a thickness in a range of, for example, about 60 micrometers for the sensors produced using MEMS technology.

Figure 5:
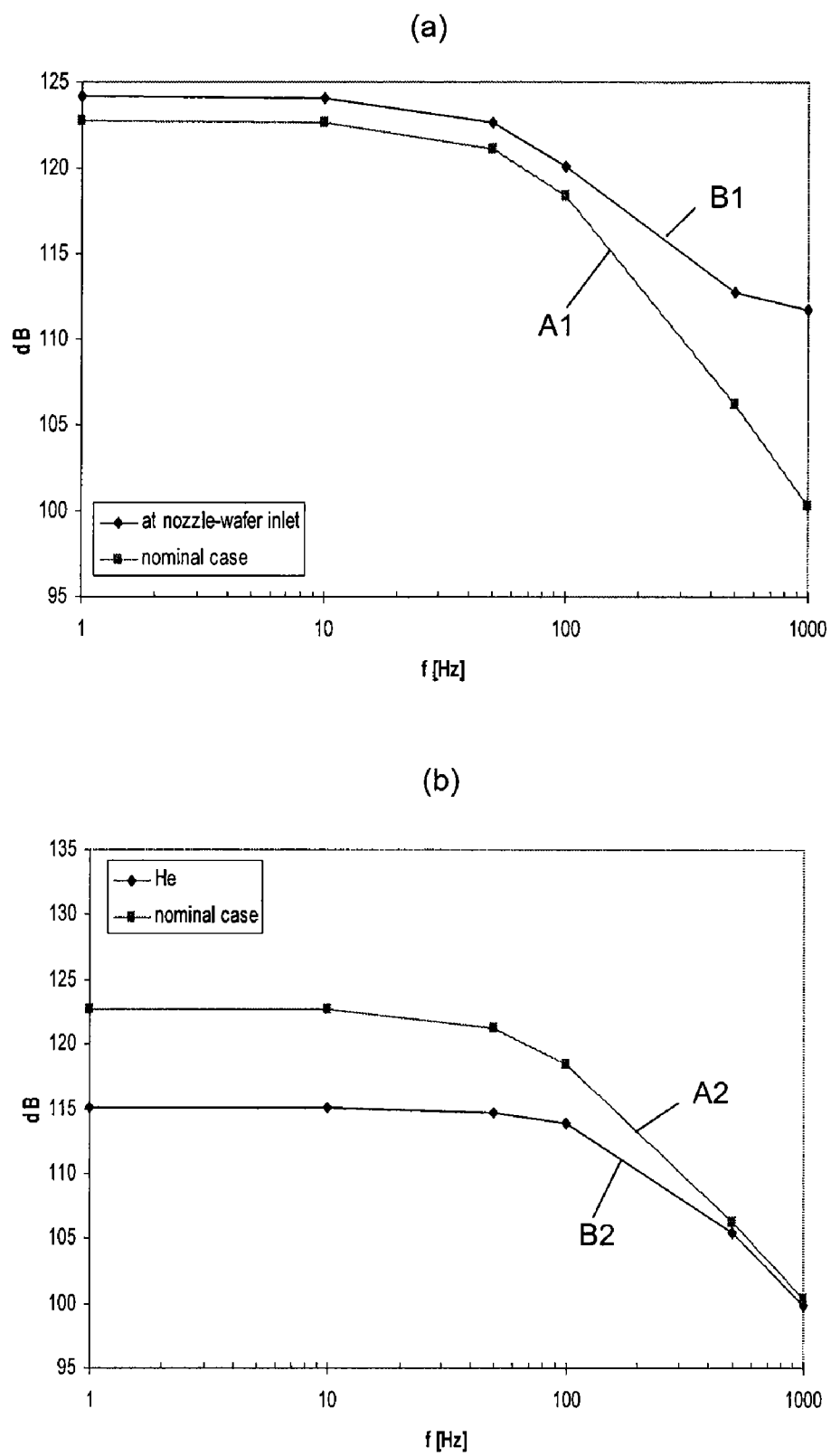
FIG. 5 depicts in a schematic way an example of a characteristic bandwidth curve for a gas gauge according to an embodiment of the invention.

FIG. 5 depicts a schematic view of typical sensitivity bandwidth curves of a gas gauge according to embodiments of the invention. FIG. 5(a) depicts schematically a comparison between a sensitivity curve A1 corresponding to a state of the art gas gauge and a curve B1, corresponding to a gas gauge according to an embodiment of the invention, wherein the pressure sensor is positioned at a gas outlet, as illustrated in FIG. 3. As a result of increased bandwidth sensitivity for the gas gauge with a pressure sensor at the outlet, the wafer surface, or any other surface, may be scanned faster to determine the surface irregularities in height (landscape).

FIG. 5(b) depicts schematically a comparison between a sensitivity curve (A2), corresponding to a state of the art gas gauge and a sensitivity curve (B2) of a gas gauge according to another aspect of the invention, when for the measurement gas, a gas having a low atomic number is selected. It is seen that in case when helium is used for the measurement gas the sensitivity range is about 15 dB for frequencies in a range of 1-1000 Hz (see curve B2). For the state of the art gas gauge (see curve A2), the sensitivity decrease is about 25 dB for the same range.

It will be appreciated that although aspects of the invention are discussed in isolation, a gas gauge including a pressure sensor as set forth in FIG. 3 and being operable using a measurement gas having a low atomic number is contemplated as well.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A gas gauge comprising:
a measurement nozzle for determining a distance from the measurement nozzle to an object, the measurement nozzle comprising a pressure sensor for measuring pressure caused by a measurement gas impinging on the object wherein the pressure sensor comprises either a membrane disk located around an outlet of the nozzle or a plurality of membrane discs arranged in a substantially common plane around an outlet of the nozzle; and
a gas conduit extending in the measurement nozzle for providing the measurement gas into the measurement nozzle,
wherein the gas gauge is operable using a gas with a low atomic number as the measurement gas.

2. The gas gauge of claim 1, wherein the measurement gas includes at least one of hydrogen and helium.

3. The gas gauge of claim 1, wherein a volume of the gas conduit is smaller than approximately $3.5 \times 10^{-7}$ $m^3$.

4. A lithographic apparatus comprising a gas gauge according to claim 1.

5. A device manufacturing method comprising:
projecting a patterned beam of radiation onto a substrate; and,
measuring a surface profile of the substrate using a gas gauge, the gas gauge comprising:
a measurement nozzle for determining a distance from the measurement nozzle to an object, the measurement nozzle comprising a pressure sensor for measuring pressure caused by a measurement gas impinging on the object wherein the pressure sensor comprises either a membrane disk located around an outlet of the nozzle or a plurality of membrane discs arranged in a substantially common plane around an outlet of the nozzle; and
a gas conduit extending in the measurement nozzle for providing the measurement gas into the measurement nozzle,
wherein the gas gauge is operable using a gas with a low atomic number as the measurement gas.

* * * * *